United States Patent [19]
Simoes

[11] 4,430,622
[45] Feb. 7, 1984

[54] OFFSET CORRECTION CIRCUIT

[75] Inventor: Richard M. Simoes, Natick, Mass.

[73] Assignee: GTE Laboratories Incorporated, Waltham, Mass.

[21] Appl. No.: 322,818

[22] Filed: Nov. 19, 1981

[51] Int. Cl.³ .............................................. H03F 1/08
[52] U.S. Cl. ...................................... 330/9; 307/491
[58] Field of Search ........................... 330/9, 51, 149; 307/491; 328/162

[56] References Cited

U.S. PATENT DOCUMENTS 4,255,715 3/1981 Cooperman ........................... 330/9

OTHER PUBLICATIONS

Jaeger et al., "Dynamic Zero-Correction Method Suppresses Offset Error in OP Amps", *Electronics*, Dec. 4, 1972, pp. 109, 110.

*Primary Examiner*—James B. Mullins
*Attorney, Agent, or Firm*—J. Stephen Yeo; Frank Bogacz

[57] ABSTRACT

This invention provides a scheme for offset correction of a unity gain amplifier used in conjunction with data sampling systems. In the present invention, the offset correction of the feedback unity gain amplifier is sensed during operation of the amplifier and is incrementally adjusted to maintain an offset voltage of approximately zero.

1 Claim, 2 Drawing Figures

OFFSET CORRECTION CIRCUIT

BACKGROUND OF THE INVENTION

1. Field of the Invention

The present invention pertains to unity gain amplifiers for use with data sampling systems and more particularly to dynamic offset correction of these unity gain amplifiers.

2. Description of the Prior Art

Differential amplifiers exhibit various operating characteristics. One such characteristic is called gain, which is defined as the ratio of the output signal to the input signal of the amplifier. Another characteristic of the differential amplifier is called offset voltage which is defined as the amount of potential difference which must be applied between the two inputs to the differential amplifier in order to make the resultant output voltage zero. The magnitude of the offset voltage of the differential amplifier is not a static number. The magnitude of the offset voltage may change with many parameters, chiefly among these is temperature.

The prior art attempts to correct for offset voltage in differential amplifiers involve the use of large coupling capacitors. Such large capacitors are not amenable to integrated circuits however. Another attempt to provide offset voltage correction is to use a smaller coupling capacitor which is buffered by an operational or differential amplifier. The smaller capacitor can be accommodated in integrated circuits, but the buffer amplifier introduces its own offset voltage which must be further corrected.

In the case of a differential amplifier without a feedback loop, the offset may be corrected readily via the second input to the amplifier. However, in a configuration where a feedback loop is present the second input is used for the feedback and, therefore, unavailable for offset control.

SUMMARY OF THE INVENTION

Accordingly, it is the object of the present invention to provide a circuit for dynamically controlling the offset correction of a unity gain feedback amplifier which is also suitable for miniaturization.

The present invention includes a differential amplifier connected between input circuitry and output circuitry. This differential amplifier has a predetermined gain and a dynamic output offset voltage which can be forced to zero for particular input differential voltages. In addition, a two-phase clock circuit is included for multiplexing the circuit between its normal amplifier use mode and the offset correction mode.

During the first phase of clock circuit, the amplifier is open circuited from the input and output circuits via transistor switches and a voltage proportional to the offset is dynamically detected and stored. During the second phase of the clock circuit, normal operation of the amplifier is permitted, however other transistor switches allow the stored charge from the first phase to increment the amount of charge previously existing. The newly accumulated charge is subsequently used to adjust the second input of the differential amplifier in order to maintain an approximately zero offset voltage.

The amplifier is connected in feedback configuration with a resistor connected between the output and the adjusting input of the differential amplifier. This feedback loop is open during phase one operation and closed during phase two operation via high speed switching transistors. A second feedback type loop has a relatively small valued capacitor connected between the output of the amplifier and ground. During the phase one, a mount of charge proportional to the offset voltage is accumulated on this capacitor. A second capacitor is connected between ground and a buffer element (operational amplifier). The second capacitor is a relatively larger valued capacitor. The output of the buffer is connected to the common connection of the first resistor with the second input to the differential amplifier. During the phase two transistor switches are operated based upon the clock to connect these two capacitors in parallel and the amount of charge stored in the first is transmitted to the second capacitor. Subsequently, the total accumulated charge is transmitted through the buffer element via a second resistor to the second input of the differential amplifier. Thereby, the differential voltage is incremented in order to effect the cancellation of the offset voltage of the differential amplifier.

DESCRIPTION OF THE PREFERRED EMBODIMENT

Figure 1:
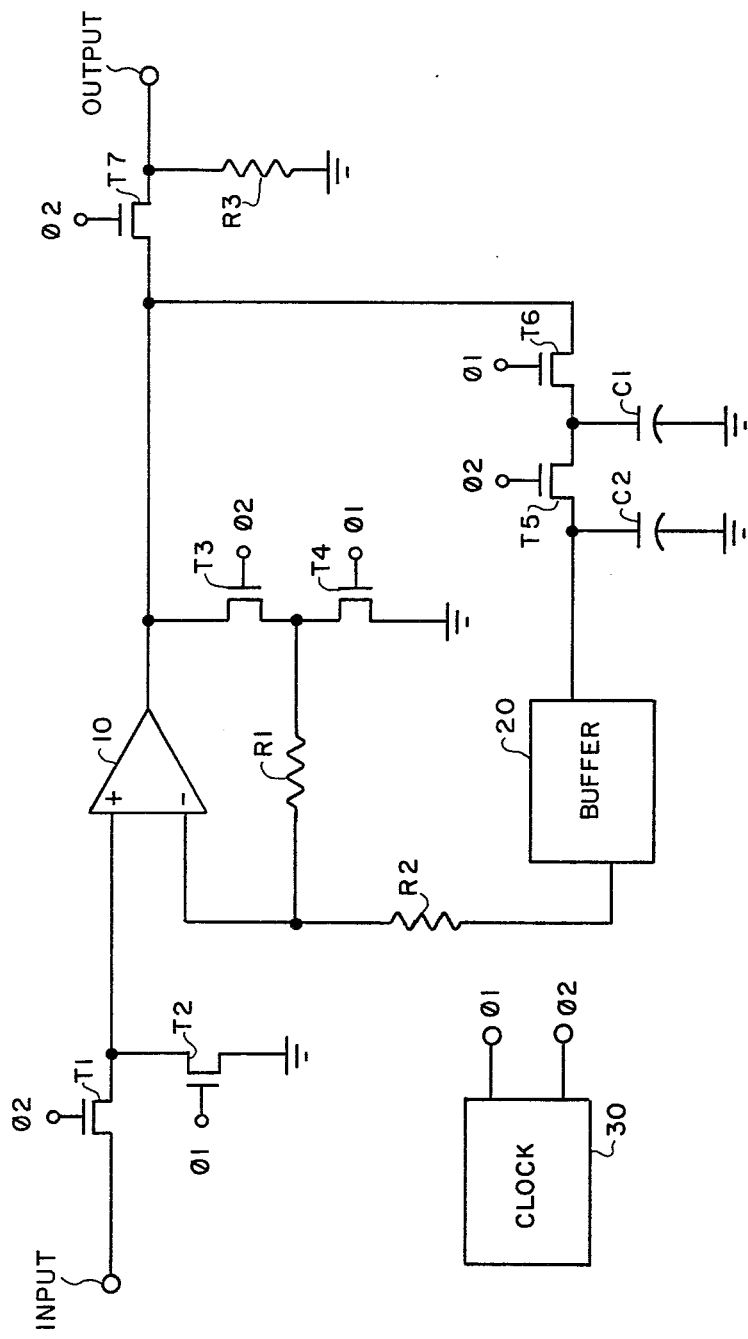
FIG. 1 is a schematic diagram embodying the principles of operation of an offset correction circuit in accordance with the present invention.

Referring to FIG. 1, a differential amplifier 10 is connected between input circuitry and output circuitry. For example, the input circuitry can be a coder/decoder (CODEC) and the output circuitry can be a filter to filter the output signal from the CODEC. In this specific use, amplifier 10 is a buffer between the CODEC and filter.

Clock 30 is shown providing two phases of periodic pulses of $\phi 1$ and $\phi 2$. A feedback connection is established from the output of differential amplifier 10 through resistor R1 to the negative input of the differential amplifier 10. Transistor T1 is connected between the circuit input and the positive input of differential amplifier 10. Similarly, transistor T7 is connected between the output of differential amplifier 10 and the output circuitry. Both T1 and T7 are operated during phase two of clock 30 cycle. Transistor T2 is connected between the positive input of differential amplifier 10 and ground and is operated in response to the first phase of clock 30. Transistor T3 is connected between the output differential amplifier 10 and resistor R1, which is connected to the negative input of amplifier 10, and transistor T3 and is operated in response to the second phase of clock 30. Transistor T4 is connected between the common connection of transistor T3 and resistor R1 and ground, and transistor T4 is operated in response to the first phase of clock 30.

A second feedback type loop connection exists as follows: a connection from the output of differential amplifier 10 to transistor T6, transistor T6 is operated in response to the first phase of clock 30; transistor T5 is connected in series with transistor T6, but is operated in response to the second phase of clock 30; capacitor C1 is connected between the common connection of transistors T5 and T6 and ground; buffer 20 is connected in series with transistor T5; capacitor C2 is connected between the common connection of buffer 20 and transistor T5 and ground; and lastly, resistor R3 is connected between buffer 20 and the negative input of differential amplifier 10.

Differential amplifier 10 may be implemented with any suitable integrated circuit such as those commercially available from any of a variety of sources. Preferably, however, it is integrated with other circuit components in a larger integrated circuit. Resistors R1 and R3 are in the range of 1,000 ohms. Resistor R2 has a value of 100,000 ohms. Capacitor C1 has a value of approximately 0.04 pf. Capacitor C2 has the value of approximately 20 pf. All transistors T1–T7 may be implemented with MOS-Field Effect Transistors. These transistors act as high speed switches in response to the appropriate phase of clock 30.

During the phase one operation of clock 30, transistor T1 will be an open circuit and transistor T2 will be operated to short the positive input of differential amplifier 10 to ground. Transistor T7 will also be an open circuit. Transistor T3 will act as an open circuit, but transistor T4 will be operated to connect resistor R1 to ground. Transistor T6 will be closed and transistor T5 will be open. As a result, capacitor C1 stores a voltage proportional to the offset voltage plus the input differential voltage times the gain of the amplifier. It is to be noted that during phase one there is no input from the sampling circuitry or output to the conversion circuitry from differential amplifier 10. During this phase the offset correction of differential amplifier 10 is detected.

During phase two of clock 30, transistor T6 will function as an open circuit and transistor T5 will operate as a short circuit. Therefore, capacitor C2 will receive the charge present on capacitor C1. The voltage at capacitor C2 will change as a voltage step, dependent on the ratio of capacitor C2 to capacitor C1. Also during phase two of clock 30, transistor T3 functions as a short circuit and transistor T4 functions as an open circuit, thereby establishing a feedback loop with resistor R1. The voltage at capacitor C2 is buffered by buffer 20 and induced to the differential amplifier 10 via resistor R2. Buffer 20 is a typical operational amplifier having high input and low output impedance. As a result of the application of the voltage at capacitor C2 to the differential amplifier 10, the input differential voltage will change in the direction in order to cancel the offset voltage of amplifier 10.

For the occurrence of successive iterations of the two phases of clock 30, successive voltage steps will be produced at capacitor C2 and as a result a differential voltage at amplifier 10 is developed which approaches the lever required for a zero level offset voltage. The voltage applied by capacitor C2 will continue to change magnitude maintaining an offset voltage at differential amplifier 10 of approximately zero. Thereby, the offset voltage of differential amplifier 10 will be continuously maintained at approximately a zero level despite the variation of parameters such as changes of temperature.

Figure 2:
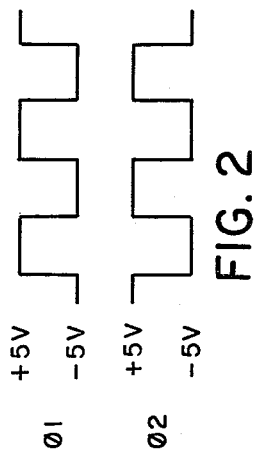
FIG. 2 is a timing diagram of the two phase clock of the present invention.

FIG. 2 is a sample waveform of the periodic pulses $\phi 1$ and $\phi 2$ of phase one and phase two respectively of clock 30.

Although a preferred embodiment of the invention has been illustrated and that form described in detail, it will be readily apparent to those skilled in the art that various modifications may be made therein; without departing from the spirit of the invention or from the scope of the appended claims.

What is claimed is:

1. An offset correction amplifier consisting of:
   an input connection (Input);
   an output connection (Output);
   a differential amplifier (10) having a positive input, a negative input, and an output;
   a clock for generating pulses of a first phase and a second phase;
   means (T1, T2) for coupling the positive input to the input connection only during the second phase;
   means (T7) for coupling the output to the output connection only during the second phase;
   a first feedback loop (R1) arranged between the negative input and the output;
   means (T3, T4) for closing the first feedback loop only during the second phase;
   a second feedback loop including a first capacitor (C1), a second capacitor (C2), and a buffer (20) arranged between the output and the negative input, said first capacitor (C1) having a capacitance less than the second capacitor (C2);
   the buffer (20) arranged to couple any voltage of the second capacitor (C2) to the negative input;
   means (T6) for coupling the first capacitor to the output only during the first phase; and
   means (T5) for coupling the first capacitor (C1) to the second capacitor (C2) during the second phase.

* * * * *